United States Patent
Yin et al.

(10) Patent No.: US 10,304,824 B2
(45) Date of Patent: May 28, 2019

(54) MANUFACTURING METHOD FOR ALAS—GE—ALAS STRUCTURE BASED PLASMA P-I-N DIODE IN MULTILAYERED HOLOGRAPHIC ANTENNA

(71) Applicant: Xi'an Creation Keji Co., Ltd., Xi'an (CN)

(72) Inventors: Xiaoxue Yin, Xi'an (CN); Liang Zhang, Xi'an (CN)

(73) Assignee: XI'AN CREATION KEJI CO., LTD., Xi'an (CN)

( * ) Notice: Subject to any disclaimer, the term of this patent is extended or adjusted under 35 U.S.C. 154(b) by 0 days.

(21) Appl. No.: 15/851,783

(22) Filed: Dec. 22, 2017

(65) Prior Publication Data

US 2018/0175027 A1    Jun. 21, 2018

Related U.S. Application Data

(63) Continuation of application No. PCT/CN2017/110915, filed on Nov. 14, 2017.

(30) Foreign Application Priority Data

Dec. 20, 2016 (CN) .......................... 2016 1 1184382

(51) Int. Cl.
    *H01L 27/08*     (2006.01)
    *H01Q 7/00*      (2006.01)
    (Continued)

(52) U.S. Cl.
CPC ...... *H01L 27/0814* (2013.01); *H01L 21/0217* (2013.01); *H01L 21/0259* (2013.01); *H01L 21/0262* (2013.01); *H01L 21/02164* (2013.01); *H01L 21/02241* (2013.01); *H01L 21/02488* (2013.01); *H01L 21/02532* (2013.01); *H01L 21/02546* (2013.01); *H01L 21/02667* (2013.01); *H01L 21/26546* (2013.01);
(Continued)

(58) Field of Classification Search
CPC . H01Q 5/40; H01Q 23/00; H01Q 7/00; H01L 21/02532; H01L 29/868
See application file for complete search history.

(56) References Cited

U.S. PATENT DOCUMENTS

| | | | |
|---|---|---|---|
| 2006/0194357 A1* | 8/2006 | Hsu ......................... | C30B 19/00 438/28 |
| 2008/0099881 A1* | 5/2008 | Jung ................... | H01L 27/0676 257/601 |
| 2009/0128428 A1* | 5/2009 | Ishizuka ................ | H01Q 1/243 343/702 |

* cited by examiner

*Primary Examiner* — Mohammed R Alam (74) *Attorney, Agent, or Firm* — Hemisphere Law, PLLC; Zhigang Ma (57) ABSTRACT

A manufacturing method for an AlAs—Ge—AlAs structure based plasma p-i-n diode in a multilayered holographic antenna is provided. The manufacturing method includes: selecting a GeOI substrate and disposing an isolation region in the GeOI substrate; etching the GeOI substrate to form a P-type trench and an N-type trench; depositing AlAs materials in the P-type trench and the N-type trench and performing ion implantation into the AlAs materials in the P-type trench and N-type trench to form a P-type active region and an N-type active region; and forming leads on surfaces of the P-type active region and the N-type active region to obtain the AlAs—Ge—AlAs structure based plasma p-i-n diode. Therefore, a high-performance Ge based plasma p-i-n diode suitable for forming a solid plasma antenna can be provided by using a deep trench isolation technology and an ion implantation process.

10 Claims, 11 Drawing Sheets

(51) Int. Cl.
*H01L 21/762* (2006.01)
*H01L 21/265* (2006.01)
*H01L 21/306* (2006.01)
*H01L 21/02* (2006.01)
*H01L 21/311* (2006.01)
*H01L 21/324* (2006.01)
*H01L 27/12* (2006.01)
*H01L 29/06* (2006.01)
*H01L 29/20* (2006.01)
*H01L 29/267* (2006.01)
*H01L 29/868* (2006.01)
*H01L 29/66* (2006.01)
*H01Q 23/00* (2006.01)
*H01L 21/84* (2006.01)
*H01L 21/8252* (2006.01)

(52) U.S. Cl.
CPC .. *H01L 21/30621* (2013.01); *H01L 21/30625* (2013.01); *H01L 21/31111* (2013.01); *H01L 21/3245* (2013.01); *H01L 21/76283* (2013.01); *H01L 21/84* (2013.01); *H01L 27/1203* (2013.01); *H01L 29/0649* (2013.01); *H01L 29/20* (2013.01); *H01L 29/267* (2013.01); *H01L 29/6609* (2013.01); *H01L 29/66219* (2013.01); *H01L 29/868* (2013.01); *H01Q 7/00* (2013.01); *H01Q 23/00* (2013.01); *H01L 21/8252* (2013.01)

MANUFACTURING METHOD FOR
ALAS—GE—ALAS STRUCTURE BASED
PLASMA P-I-N DIODE IN MULTILAYERED
HOLOGRAPHIC ANTENNA

FIELD OF THE DISCLOSURE

The disclosure relates to the field of manufacturing electronic components, and more particularly to a manufacturing method for an AlAs—Ge—AlAs structure based plasma p-i-n (also referred to as Positive-Intrinsic-Negative or P-type-Intrinsic-N-type) diode in a multilayered holographic antenna.

BACKGROUND

A holographic antenna has a holographic structure and thus can well meet actual requirements of users in specific occasions, and has better application prospect. A reconfigurable antenna, particularly a frequency reconfigurable antenna, can work in a case of multiple frequencies and attracts wide attention, and an, applicable range is greatly widened. It is a very important and significant problem to employ what kind of material and process to produce the frequency reconfigurable holographic antenna.

At present, a material adopted by a p-i-n diode applied to the reconfigurable antenna at domestic and foreign is a bulk silicon material, such material has a problem of lower carrier mobility of an intrinsic region, which affects a carrier concentration of the intrinsic region of the p-i-n diode and thereby affects a concentration of solid plasma. Besides, a P-type region and an N-type region of such structure are formed by mostly adopting an implantation process, but such method requires larger implantation dosage and energy, has high requirements on equipment and is incompatible with the existing process. However, if a diffusion process is adopted, a junction depth is deeper, but the P-type region and the N-type region have larger areas, achieving a low integration level and uneven doping concentration, thereby affecting electrical properties of the p-i-n diode and leading to poor controllability in concentration and distribution of the solid plasma.

SUMMARY

Therefore, in order to solve the technical defects and deficiencies of the prior art, the disclosure provides a manufacturing method for an AlAs—Ge—AlAs structure based plasma p-i-n diode in a multilayered holographic antenna.

In particular, an embodiment of the disclosure provides a manufacturing method for an AlAs—Ge—AlAs structure based, plasma p-i-n diode in a multilayered holographic antenna. The p-i-n diode is configured (i.e., structured and arranged) for preparing the holographic antenna. The holographic antenna includes a semiconductor substrate, an antenna module, a first holographic ring and a second holographic ring. Each of the antenna module, the first holographic ring and the second holographic ring is formed on the semiconductor substrate by a semiconductor process; and each of the antenna module, the first holographic ring and the second holographic ring includes sequentially connected p-i-n diode strings. The manufacturing method includes:
(a) selecting a GeOI substrate, preparing a $SiO_2$ material on a surface of the GeOI substrate to form a first $SiO_2$ layer, and preparing a SiN material on a surface of the first $SiO_2$ layer to form a first SiN layer, wherein the first $SiO_2$ layer and the first SiN layer constitute a first protective layer on the surface of the GeOI substrate;
(b) forming a first isolation region pattern on the first protective layer by a photolithography process;
(c) etching the first protective layer and the GeOI substrate in designated positions of the first isolation region pattern by a dry etching process, to form isolation trenches, wherein a depth of the isolation trenches being larger than or equal to a thickness of a top Ge layer of the GeOI substrate;
(d) filling the isolation trenches to form an isolation region;
(e) etching the GeOI substrate to form a P-type trench and an N-type trench;
(f) depositing AlAs materials in the P-type trench and the N-type trench, and performing ion implantation into the AlAs materials in the P-type trench and the N-type trench to form a P-type active region and an N-type active region; and
(g) forming leads on surfaces of the P-type active region and the N-type active region to obtain the AlAs—Ge—AlAs structure based plasma p-i-n diode.

On the basis of the above embodiment, the step (e) includes:
(e1) forming a second protective layer on a surface of the GeOI substrate;
(e2) forming a second isolation region pattern on the second protective layer by a photolithography process; and
(e3) etching the second protective layer and the top Ge layer of the GeOI substrate in designated positions of the second isolation region pattern by a dry etching, process, to form the P-type trench and the N-type trench in the top Ge layer of the GeOI substrate.

On the basis of the above embodiments, the second protective layer includes a second $SiO_2$ layer and a second SiN layer, and correspondingly the step (e1) includes:
(e11) preparing a $SiO_2$ material on the surface of the GeOI substrate to form the second $SiO_2$ layer; and
(e12) preparing a SiN material on a surface of the second $SiO_2$ layer to form the second SiN layer.

On the basis of the above embodiment, before the step (f), the manufacturing method further includes:
(x1) oxidizing the P-type trench and the N-type trench to form oxide layers on inner walls of the P-type trench and the N-type trench; and
(x2) etching the oxide layers on the inner walls of the P-type trench and the N-type trench by a wet etching process, to planarize the inner walls of the P-type trench and the N-type trench.

On the basis of the above embodiment, the step (f) includes:
(f1) depositing the AlAs materials in the P-type trench and the N-type trench and on an entire surface of the substrate by a MOCVD process;
(f2) forming an AlAs layer on the GeOI substrate after planarizing the GeOI substrate by a CMP process;
(f3) patterning the AlAs layer by photolithography, and implanting a P-type impurity and an N-type impurity respectively into positions, where the P-type trench and the N-type trench are located by an ion implantation process with a photoresist, to form the P-type active region and the N-type active region and meanwhile form a P-type contact region and an N-type contact region;

(f4) removing the photoresist; and
(f5) removing the AlAs materials outside the P-type contact region and the N-type contact region by a wet etching process.

On the basis of the above embodiment, after the step (f), the manufacturing method further includes:
(y1) preparing an $SiO_2$ material on an entire surface of the substrate; and
(y2) activating impurities in the P-type active region and the N-type active region by an annealing process.

On the basis of the above embodiment, the step (g) includes:
(g1) etching the $SiO_2$, materials in designated positions on surfaces of the P-type contact region and the N-type contact region by an anisotropic etching process to form lead holes; and
(g2) depositing metal materials into the lead holes, performing a passivation treatment on the substrate and forming PADs by photolithography, to form the AlAs—Ge—AlAs structure based plasma p-i-n diode.

On the basis of the above embodiment, the antenna module includes a first p-i-n diode antenna arm, a second p-i-n diode antenna arm, a coaxial feeder, a first DC bias wire, a second DC bias wire, a third DC bias wire, a fourth DC bias wire, a fifth DC bias wire, a sixth DC bias wire, a seventh DC bias wire and an eighth DC bias wire;

an inner core wire and an outer conductor of the coaxial feeder are respectively welded on the first DC bias wire and the second DC bias wire; the first DC bias wire, the fifth DC bias wire, the third DC bias wire and the fourth DC bias wire are electrically connected to the first p-i-n diode antenna arm and arranged along a lengthwise direction of the first p-i-n diode antenna arm; and
the second DC bias wire, the sixth DC bias wire, the seventh DC bias wire and the eighth DC bias wire are electrically connected to the second p-i-n diode antenna arm and arranged along a lengthwise direction of the second p-i-n diode antenna arm.

On the basis of the above embodiment, each of the p-i-n diode strings includes a plurality of p-i-n diodes; and each of the p-i-n diodes comprises a P+ region, an N+ region and an intrinsic region, and further comprises a first metal contact region and a second metal contact region;

one end of the first metal contact, region is electrically connected to the P+ region while the other end is electrically connected to one of the DC bias wires or the second metal contact region of an adjacent p-i-n diode; and one end of the second metal contact region is electrically connected to the N+ region while the other end is electrically connected to one of the DC bias wires or the first metal contact region of an adjacent p-i-n diode.

On the basis of the above embodiment, the holographic antenna further includes: at least one third holographic ring, disposed on an outer side of the second holographic ring and formed on the semiconductor substrate by a semiconductor process.

The manufacturing method for an AlAs—Ge—AlAs structure based plasma p-i-n diode according to the disclosure may have the following advantages.
(1) Due to the characteristics of high mobility and long carrier service life of the Ge material used by the p-i-n diode, a solid plasma concentration of the p-i-n diode can be effectively improved.
(2) The p-i-n diode adopts a heterojunction structure, the i region is Ge and has high carrier mobility and narrower energy gap, the polycrystalline AlAs is filled into the P-type and N-type regions so as to form the heterojunction structure, and the energy gap of the AlAs material is larger than that of Ge, thereby generating a high implantation ratio and improving device performances.
(3) The p-i-n diode adopts the heterojunction structure, and a lattice mismatch ratio of the Ge of the i region to the polycrystalline AlAs of the P-type and N-type regions is lower. Therefore, defects in a heterojunction interface are less, and the device performances are improved.
(4) The p-i-n diode adopts an etching-based deep trench dielectric isolation process, thereby effectively improving a breakdown voltage of the device and inhibiting influences of a leak current on the device performances.

Other aspects and features of the disclosure will become apparent from the following detailed description with reference to the attached drawings. It should be understood, however, that the drawings are designed solely for the purpose of illustration and not as a definition of the limits of the disclosure, for which reference should be made to the appended claims. It should also be understood that, unless otherwise indicated, it is not necessary to scale the drawings, and they simply try to conceptually explain the structures and processes described herein.

BRIEF DESCRIPTION OF THE DRAWINGS

Specific embodiments of the disclosure are explained in detail in combination with drawings.

DETAILED DESCRIPTION OF PREFERRED EMBODIMENTS

In order to make the objects, features and advantages of the disclosure more obvious and easier to understand, the specific embodiments of the disclosure are explained in detail in combination with drawings.

The disclosure provides a manufacturing method and a device for an AlAs—Ge—AlAs structure based plasma p-i-n diode suitable for forming a solid plasma reconfigurable antenna. The AlAs—Ge—AlAs structure based plasma p-i-n diode is a transverse p-i-n diode formed based on germanium-on-insulator (GeOI), and when a DC bias voltage is applied, a DC current will form solid plasma consisting of free carriers (electrons and holes) on the surface. The plasma has metal-like characteristics, that is, a reflection action for electromagnetic waves, and the reflection characteristic is closely related to microwave transmission characteristics, concentration and distribution of surface plasma.

A GeOI transverse solid plasma p-i-n diode reconfigurable antenna may be formed by arranging GeOI transverse solid plasma p-i-n diodes in an array, and by externally controlling selective conduction (turned-on) of the solid plasma p-i-n diodes in the array, the array is caused to faint dynamic stripes of the solid plasma, which have an antenna function and a function of emitting and receiving specific electromagnetic waves. Such antenna can change the stripe shape and distribution of the solid plasma by selective conductions of the solid plasma p-i-n diodes in the array, thereby realizing reconfiguration of the antenna. An important application prospect in aspects of national defense communication and radar technologies is realized.

In the following, a process flow for the GeOI-based solid plasma p-i-n diode prepared in the disclosure will be further described in detail. In the drawings, for the purpose of convenient explanation, the thicknesses of layers and regions are zoomed in or out, and the shown sizes do not represent actual sizes.

Figure 1:
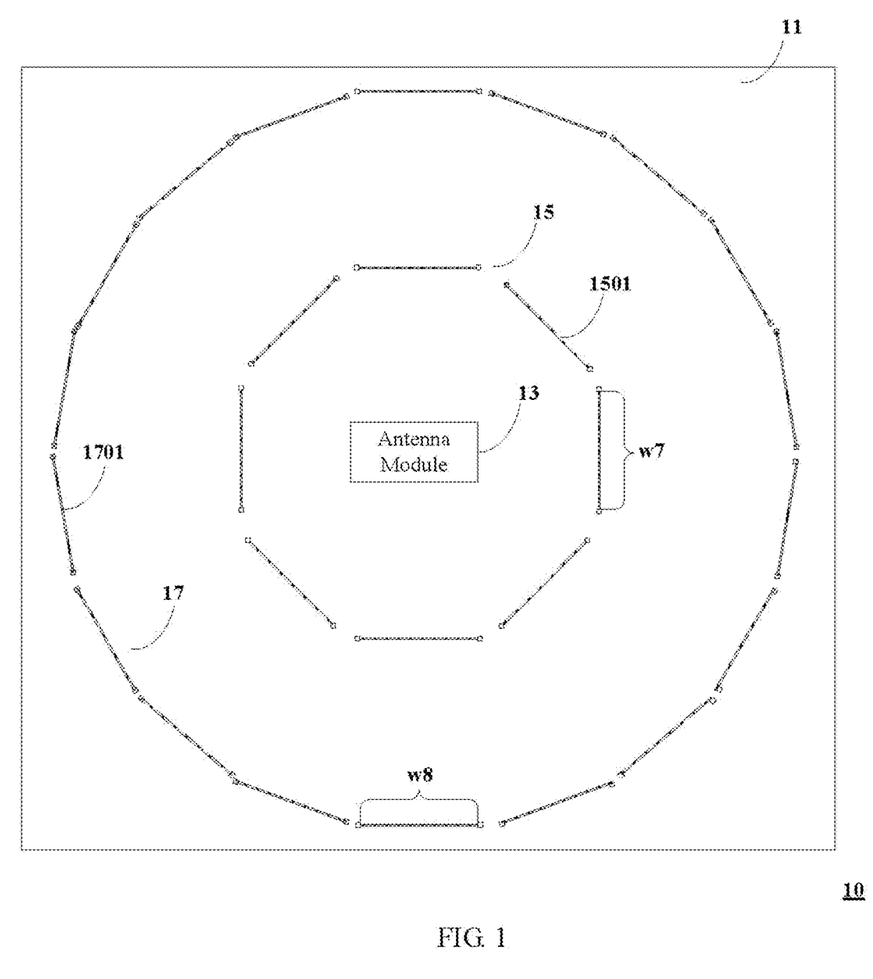
FIG. 1 is a schematic structural view of a reconfigurable multilayered holographic antenna provided by an embodiment of the disclosure.

An embodiment of the disclosure provides a manufacturing method for an AlAs—Ge—AlAs structure based plasma p-i-n diode in a multilayered holographic antenna, and the p-i-n diode is used for preparing the holographic antenna. Referring to FIG. 1, FIG. 1 is a schematic structural view of a reconfigurable multilayered holographic antenna provided by an embodiment of the disclosure. The holographic antenna includes a semiconductor substrate 11, an antenna module 13, a first holographic ring 15 and a second holographic ring 17. The antenna module 13, the first holographic ring 15 and the second holographic ring 17 are all manufactured on the semiconductor substrate 11 by semiconductor processes; and the antenna module 13, the first holographic ring 15 and the second holographic ring 17 each include sequentially connected p-i-n diode strings.

Figure 2:
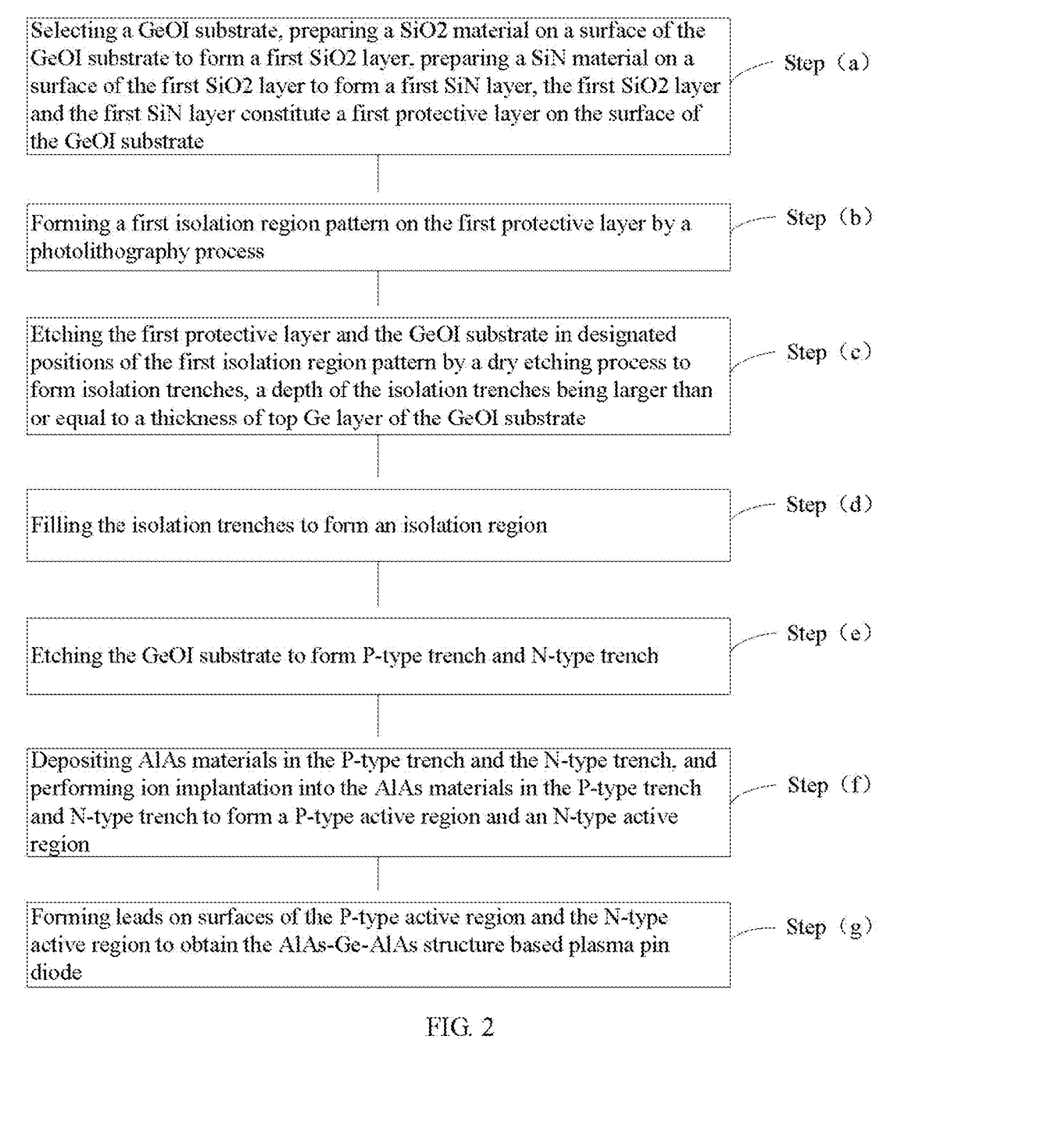
FIG. 2 is a schematic view of a manufacturing method for an AlAs—Ge—AlAs structure based plasma p-i-n diode in a multilayered holographic antenna provided by an embodiment of the disclosure.

Referring to FIG. 2, FIG. 2 is a schematic view of a manufacturing method for an AlAs—Ge—AlAs structure based plasma p-i-n diode in a multilayered holographic antenna provided by an embodiment of the disclosure. The manufacturing method includes several steps as follows.

Step (a): selecting a GeOI substrate, preparing a $SiO_2$ material on a surface of the GeOI substrate to form a first $SiO_2$ layer, preparing a SiN material on a surface of the first $SiO_2$ layer to form a first SiN layer, wherein the first $SiO_2$ layer and the first SiN layer constitute a first protective layer on the surface of the GeOI substrate.

In this step, the cause of adopting the GeOI substrate is that a better microwave characteristic is required for the solid plasma antenna, while in order to meet this requirement, the solid plasma p-i-n diode needs to possess better isolation characteristic and limiting capacity for carriers, i.e., the solid plasma. The GeOI substrate can conveniently form a p-i-n isolation region with isolation trenches and $SiO_2$ can also limit the carriers, i.e., the solid plasma in top Ge layer. Therefore the GeOI is preferably adopted as a substrate of the solid plasma p-i-n diode. Besides, since a carrier mobility of the Ge material is larger, a higher plasma concentration can be formed in an I region, thereby improving device performances.

Benefits of forming the first protective layer in the method of the illustrated embodiment lie in that: a stress of the SiN is isolated by use of a looseness characteristic of the $SiO_2$, such that the stress cannot be delivered into the top Ge layer, thereby ensuring stability of performances of the top Ge layer. Based on a high selection ratio of the SiN to Ge during a dry etching, and by using the SiN as a mask of the dry etching, the process is easy to implement. Of course, it is understandable that a layer number of the protective layer and a material of the protective layer are not limited here as long as the protective layer can be formed.

Step (b): forming a first isolation region pattern on the first protective layer by a photolithography process.

Step (c): etching the first protective layer and the GeOI substrate in designated positions of the first isolation region pattern by a dry etching process, to form isolation trenches, depths of the isolation trenches being larger than or equal to a thickness of the top Ge layer of the GeOI substrate, i.e., the bottoms of the isolation trenches are below the top Ge layer.

The depths of the isolation trenches are larger than or equal to the thickness of the top Ge layer, which ensures subsequent connection between the $SiO_2$ in the trenches and an oxide layer of the GeOI substrate, to thereby form a complete insulating isolation.

Step (d): filling the isolation trenches to form an isolation region.

Step (e): etching the GeOI substrate to form P-type trench and N-type trench.

Step (f): depositing AlAs materials in the P-type trench and the N-type trench, and performing ion implantation into the AlAs materials in the P-type trench and N-type trench to form a P-type active region and an N-type active region.

Step (g): forming leads on surfaces of the P-type active region and the N-type active region to obtain the AlAs—Ge—AlAs structure based plasma p-i-n diode.

Further, on the basis of the above embodiment the step (e) includes:
(e1) forming a second protective layer on the surface of the GeOI substrate;
(e2) forming a second isolation region pattern on the second protective layer by a photolithography process; and
(e3) etching the second protective layer and the top Ge layer of the GeOI substrate in designated positions of the second isolation region pattern by a dry etching process, to form the P-type trench and the N-type trench in the top Ge layer.

The depths of the P-type trench and the N-type trench are larger than a thickness of the second protective layer but smaller than a sum of the thicknesses of the second protective layer and the top Ge layer of the GeOI substrate. Preferably, a distance between bottoms of the P-type trench and the N-type trench and the bottom of the top Ge layer of the GeOI substrate is 0.5 micrometer to 30 micrometers, and a generally recognized deep trench is formed. In this way, high-doping concentration P-type and N-type regions with uniformly distributed impurities and steep Pi and Ni junctions may be formed when the P-type and N-type active regions are formed, which is favorable to improve a plasma concentration of the i region.

Further, on the basis of the above embodiment, the second protective layer includes a second SiO$_2$ layer and a second SiN layer, and correspondingly the step (e1) includes:

(e11) preparing a SiO$_2$ material on the surface of the GeOI substrate to form a second SiO$_2$ layer; and (e12) preparing a SiN material on a surface of the second SiO$_2$ layer to form a second SiN layer.

The benefits of the step of forming the second protective layer are similar to those of the first protective layer and are not repeated.

Further, on the basis of the above embodiment, before the step (I), the manufacturing method further includes:

(x1) oxidizing the P-type trench, and the N-type trench to form oxide layers on inner walls of the P-type trench and the N-type trench; and (x2) etching the oxide layers on the inner walls of the P-type trench and the N-type trench by a wet etching process, to planarize the inner walls of the P-type trench and the N-type trench. The benefits of these steps are to prevent protrusions on the side walls of the trenches from forming, an electric field concentrated region and from causing breakdown of the Pi and Ni junctions.

Further, on the basis of the above embodiment, the step (f) includes:

(f1) depositing AlAs materials in the P-type trench and the N-type trench and on an entire surface of the substrate by a MOCVD (metal organic chemical vapor deposition) process;

(f2) forming an AlAs layer on the GeOI substrate after planarizing the GeOI substrate by a CMP (chemical mechanical polishing) process;

(f3) patterning the AlAs layer by photolithography, and implanting a P-type impurity and an N-type impurity respectively into positions where the P-type trench and the N-type trench are located by an ion implantation process with a photoresist, to form the P-type active region and the N-type active region and meanwhile form a P-type contact region and an N-type contact region;

(f4) removing the photoresist; and (f5) removing the AlAs materials outside the P-type contact region and the N-type contact region by a wet etching process.

Further, on the basis of the above embodiment, after the step (f), the manufacturing method further includes:

(y1) preparing a SiO$_2$ material on an entire surface of the substrate; and (y2) activating the impurities in the P-type active region and the N-type active region by an annealing process.

Further, on the basis of the above embodiment, the step (g) includes:

(g1) etching the SiO$_2$ materials in designated positions of the P-type contact region and the N-type contact region by an anisotropic etching process to form lead holes; and (g2) depositing metal materials into the lead holes, performing a passivation treatment on the substrate and forming PADs by photolithography, to form the AlAs—Ge—AlAs structure based plasma p-i-n diode.

Figure 3:
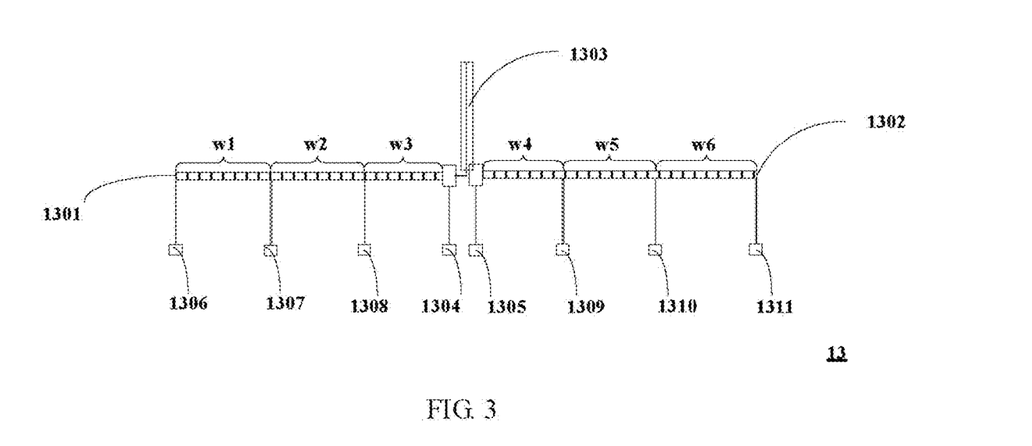
FIG. 3 is a schematic structural view of an antenna module according to an embodiment of the disclosure.

Further based on the above embodiment, referring to FIG. 3, FIG. 3 is a schematic structural view of an antenna module according to an embodiment of the disclosure. The antenna module (13) includes a first p-i-n diode antenna arm 1301, a second p-i-n diode antenna arm 1302, a coaxial feeder 1303, a first. DC (direct current) bias wire 1304, a second DC bias wire 1305, a third DC bias 1306, a fourth DC bias wire 1307, a fifth DC bias wire 1308, a sixth DC bias wire 1309, a seventh DC bias wire 1310 and an eighth DC bias wire 1311.

An inner core wire and an outer conductor of the coaxial feeder 1303 are respectively welded on the first DC bias wire 1304 and the second DC bias wire 1305; the first DC bias wire 1304, the fifth DC bias wire 1308, the third DC bias wire 1306 and the fourth DC bias wire 1307 are electrically connected to the first p-i-n diode antenna arm 1301 and arranged along a lengthwise direction of the first p-i-n diode antenna arm 1301.

The second DC bias wire 1305, the sixth DC bias, wire 1309, the seventh DC bias wire 1310 and the eighth DC bias wire 1311 are electrically connected to the second p-i-n diode antenna arm 1302 and arranged along a lengthwise direction of the second p-i-n diode antenna arm 1302.

Optionally, the first p-i-n diode antenna arm 1301 includes a first p-i-n diode string will, a second p-i-n diode string w2 and a bird p-i-n diode string w3 which are serially connected in sequence; the second p-i-n diode antenna arm 1302 includes a fourth p-i-n diode string w4, a fifth p-i-n diode string w5 and a sixth p-i-n diode string w6 which are serially connected in sequence. The first p-i-n diode string w1 and the sixth p-i-n diode string w6, the second p-i-n diode string w2 and the fifth p-i-n diode string w5, the third p-i-n diode string w3 and the fourth p-i-n diode string w4 include equal numbers of p-i-n diodes.

Figure 4:
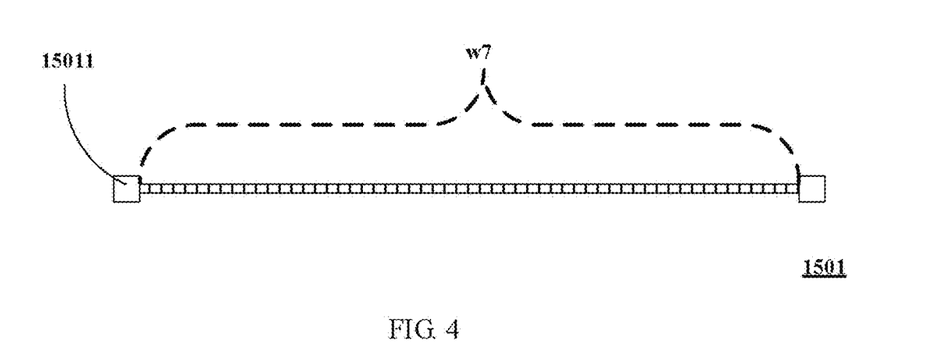
FIG. 4 is a schematic structural view of a first ring unit provided by an embodiment of the disclosure.

Further, referring to FIG. 4, FIG. 4 is a schematic structural view of a first ring unit provided by an embodiment of the disclosure. The first holographic ring 15 includes a plurality of first ring units 1501 disposed annularly and uniformly. The first ring unit 1501 includes ninth DC bias wires 15011 and a seventh p-i-n diode string w7, and the ninth DC bias wires 15011 are electrically connected to two ends of the seventh p-i-n diode string w7.

Figure 5:
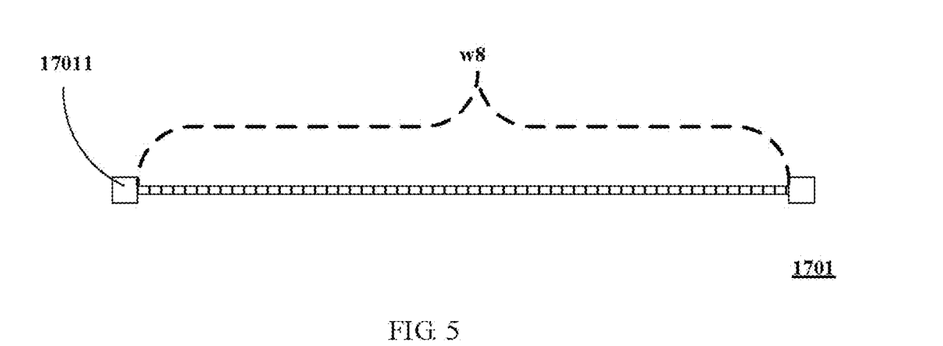
FIG. 5 is a schematic structural view of a second ring unit provided by an embodiment of the disclosure.

Further, referring to FIG. 5, FIG. 5 is a schematic structural view of a second ring unit provided by an embodiment of the disclosure. The second holographic ring 17 includes a plurality of second ring units 1701 disposed annularly and uniformly. The second ring unit 1701 includes tenth DC bias wires 17011 and an eighth p-i-n diode string w8, and the tenth DC bias wires 17011 are electrically connected to two ends of the eighth p-i-n diode string w8.

Figure 6:
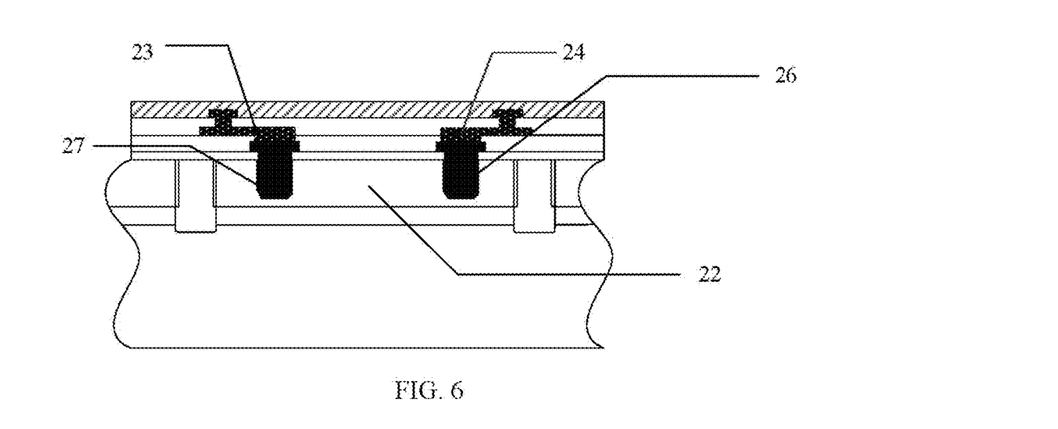
FIG. 6 is a schematic structural view of an AlAs—Ge—AlAs structure based plasma p-i-n diode in a multilayered holographic antenna provided by an embodiment of the disclosure.
Figure 7:
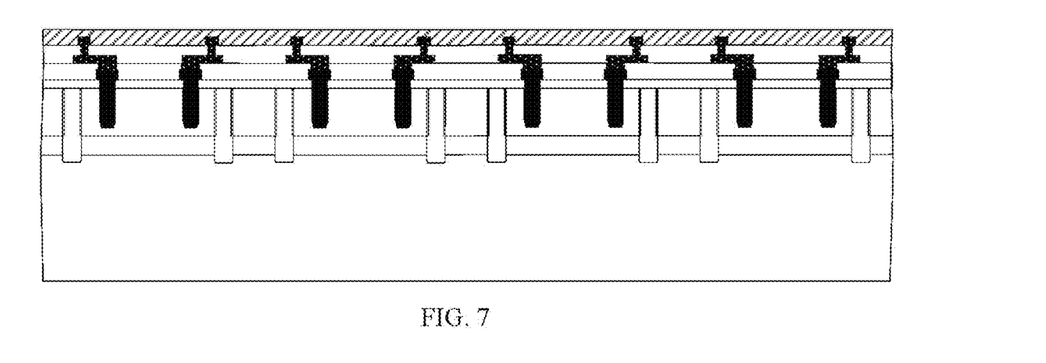
FIG. 7 is a schematic structural view of an AlAs—Ge—AlAs structure based plasma p-i-n diode string in a multilayered holographic antenna provided by an embodiment of the disclosure.

Further, based on the above embodiment, the p-i-n diode string includes a plurality of p-i-n diodes, referring to FIGS. 6 and 7. FIG. 6 is a schematic structural view of an AlAs—Ge—AlAs structure based plasma p-i-n diode in a multilayered holographic antenna provided by an embodiment of the disclosure, and FIG. 7 is a schematic structural view of an AlAs—Ge—AlAs structure based plasma p-i-n diode string in a multilayered holographic antenna provided by an embodiment of the disclosure. As shown in FIG. 6, the p-i-n diode includes a P+ region 27, an N+ region 26 and an intrinsic region 22, and further includes a first metal contact region 23 and a second metal contact region 24.

One end of the first metal contact region 23 is electrically connected to the P+ region 27 while the other end is electrically connected to one of the DC bias wires 1304, 1305, 1306, 1307, 1308, 1309, 1310, 1311, 15011 and 17011 or the second metal contact region 24 of an adjacent p-i-n diode. One end of the second metal contact region 24 is electrically connected to the N+ region 26 while the other end is electrically connected to one of the DC bias wires 1304, 1305, 1306, 1307, 1308, 1309, 1310, 1311, 15011 and 17011 or the first metal contact region 23 of an adjacent p-i-n diode.

Figure 10:
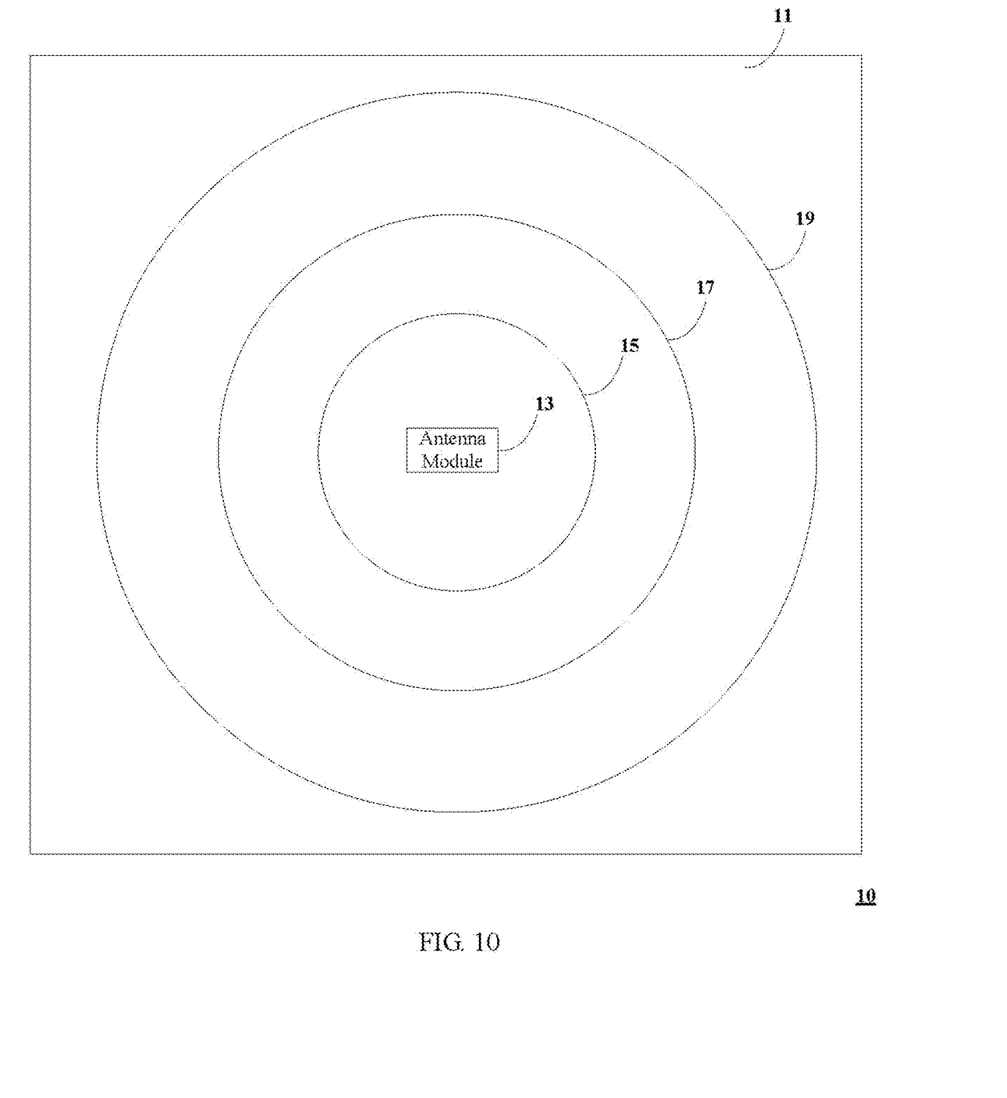
FIG. 10 is a schematic structural view of another reconfigurable multilayered holographic antenna provided by an embodiment of the disclosure.

Further, based on the above embodiment, referring to FIG. 10, FIG. 10 is a schematic structural view of another reconfigurable multilayered holographic antenna provided by an embodiment of the disclosure. The holographic antenna further includes: at least one third holographic ring 19, disposed on an outer side of the second holographic ring 17 and manufactured on the semiconductor substrate 11 by a semiconductor process.

The manufacturing method for an AlAs—Ge—AlAs structure based, plasma p-i-n diode according to the disclosure may have the following advantages.

(1) Due to the characteristics of high mobility and long carrier service life of the Ge material used by the p-i-n diode, a solid plasma concentration of the p-i-n diode can be effectively improved.

(2) The p-i-n diode adopts heterojunction structures, the i region is Ge and has high carrier mobility and narrower energy gap, the polycrystalline AlAs is filled into the P-type and N-type regions so as to form the heterojunction structures, and the energy gap of the AlAs materials is larger than that of Ge, thereby generating a high injection ratio and improving device performances.

(3) The p-i-n diode adopts the heterojunction structure, and a lattice mismatch ratio of the Ge of the i region to the polycrystalline AlAs of the P-type and N-type regions is lower. Therefore, defects in a heterojunction interface are less, and the device performances are improved.

(4) The p-i-n diode adopts an etching-based deep trench dielectric isolation process, thereby effectively improving a breakdown voltage of the device and inhibiting influences of a leak current on the device performances.

Figure 8A:
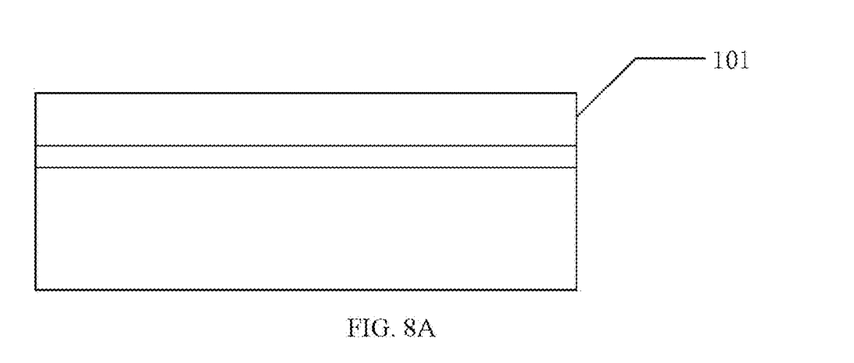
FIGS. 8A to 8R are schematic views of another manufacturing method for an AlAs—Ge—AlAs structure based plasma p-i-n diode in a multilayered holographic antenna provided by an embodiment of the disclosure.
Figure 8B:
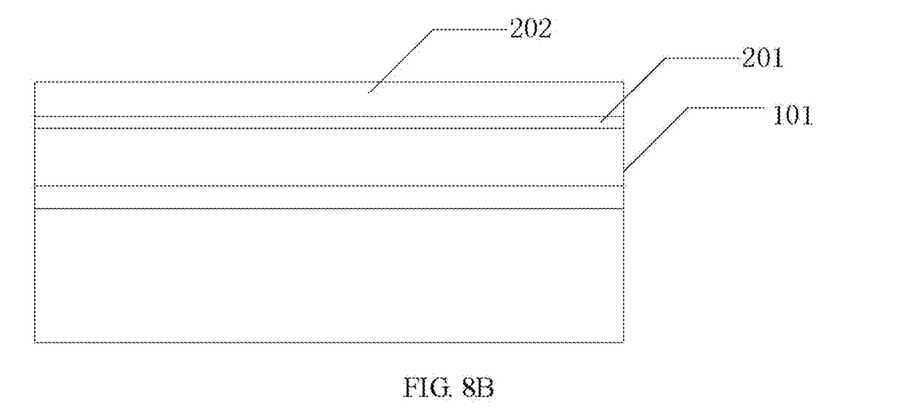
Figure 8C:
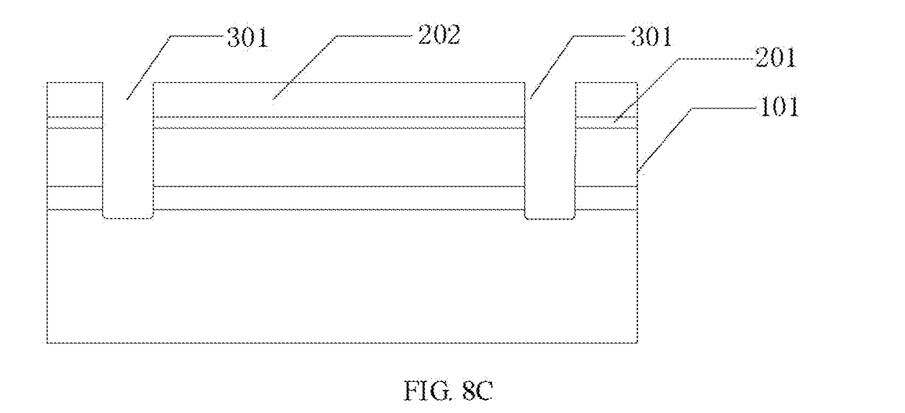
Figure 8D:
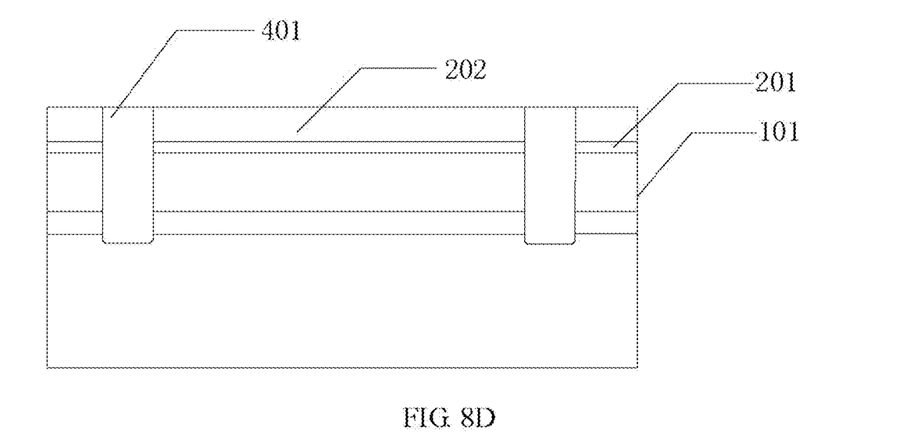
Figure 8E:
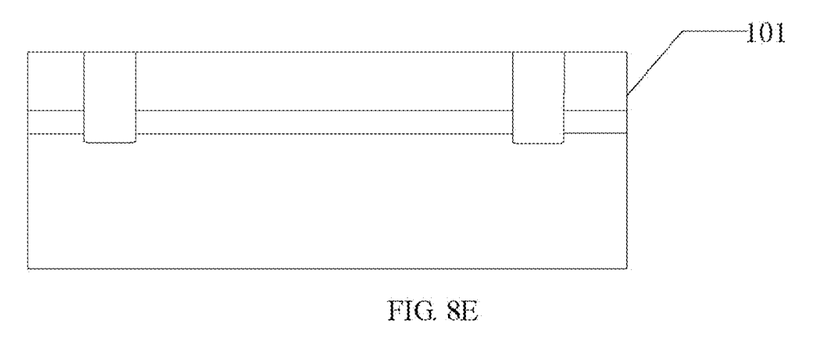
Figure 8F:
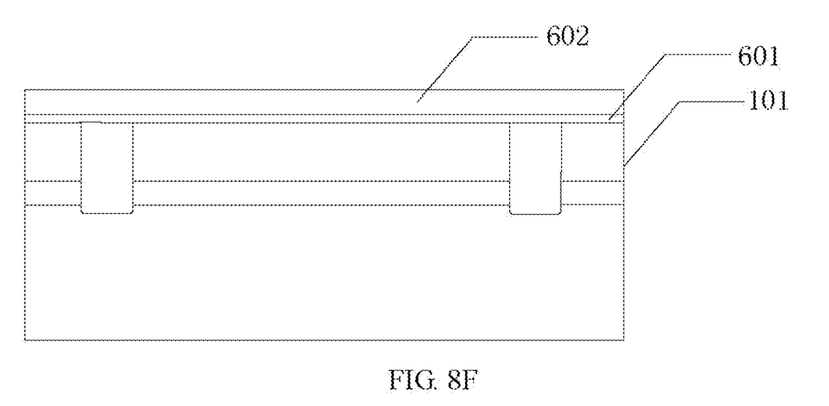
Figure 8G:
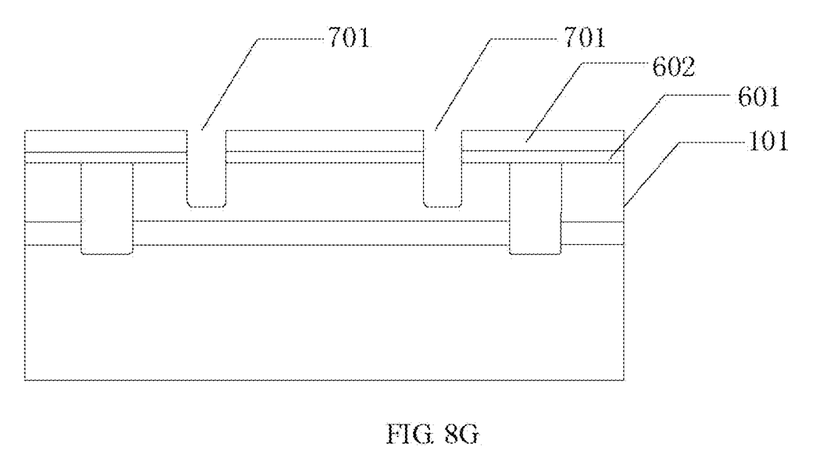
Figure 8H:
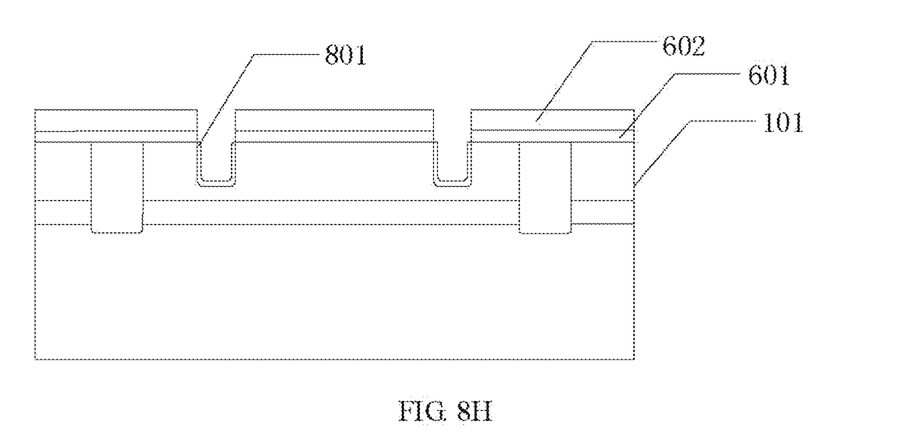
Figure 8I:
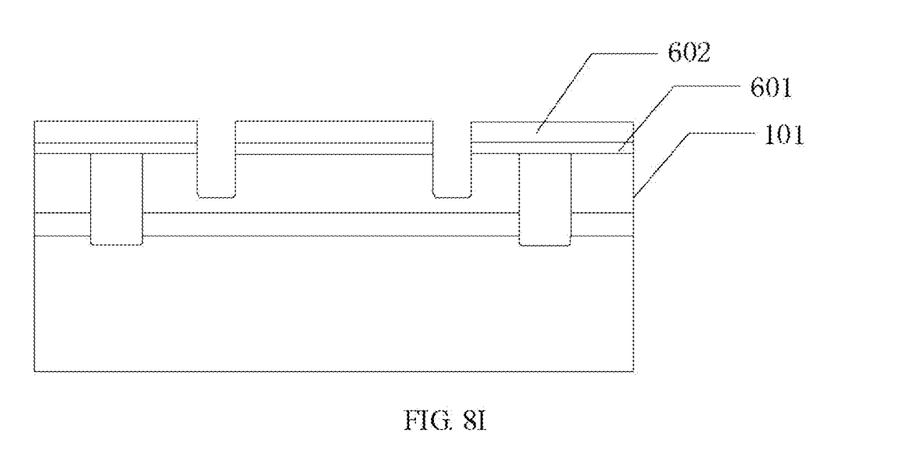
Figure 8J:
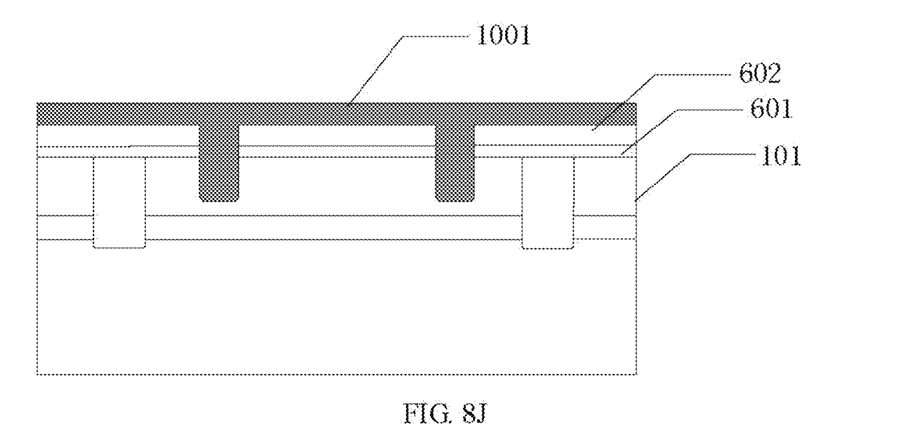
Figure 8K:
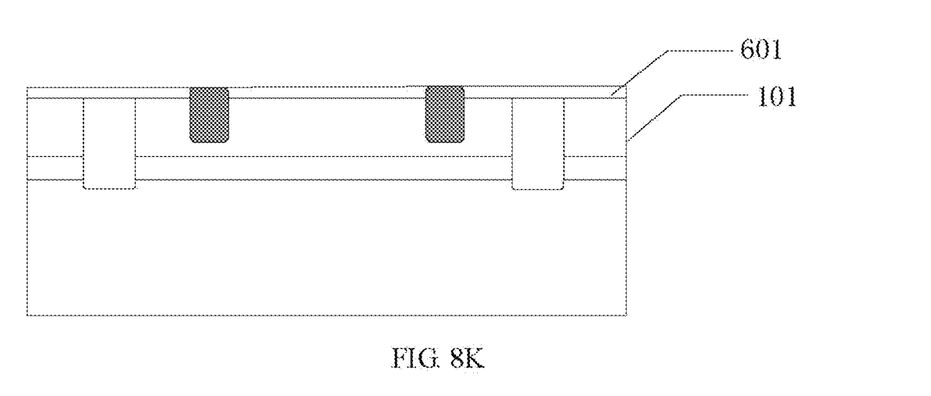
Figure 8L:
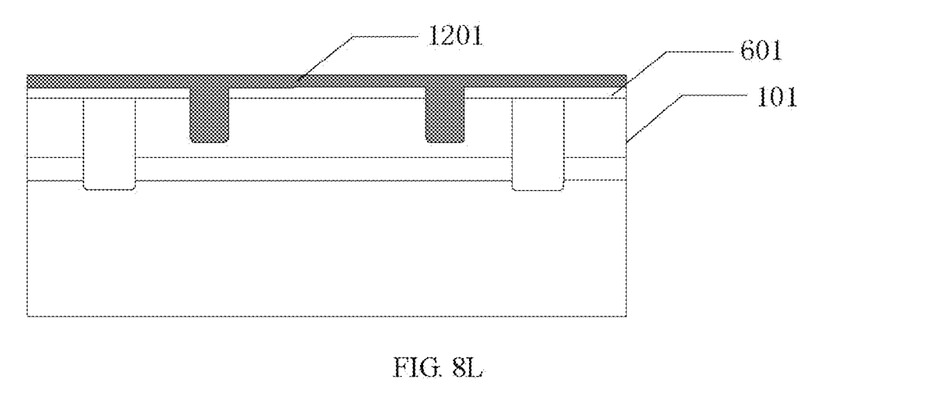
Figure 8M:
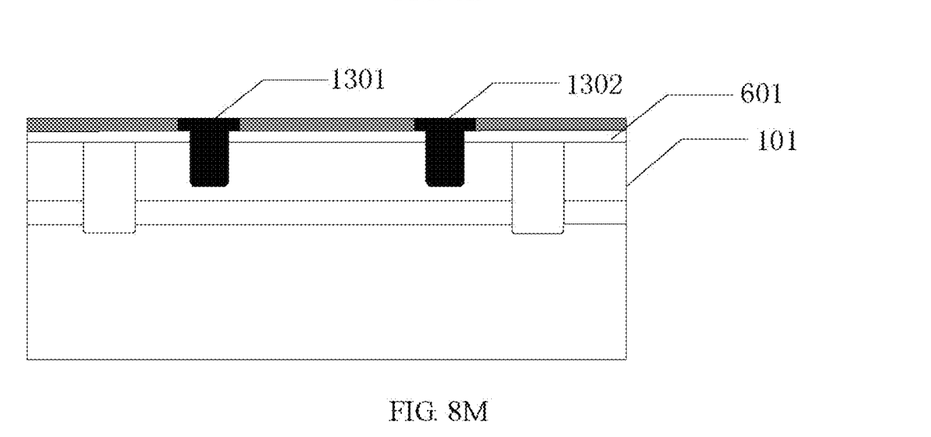
Figure 8N:
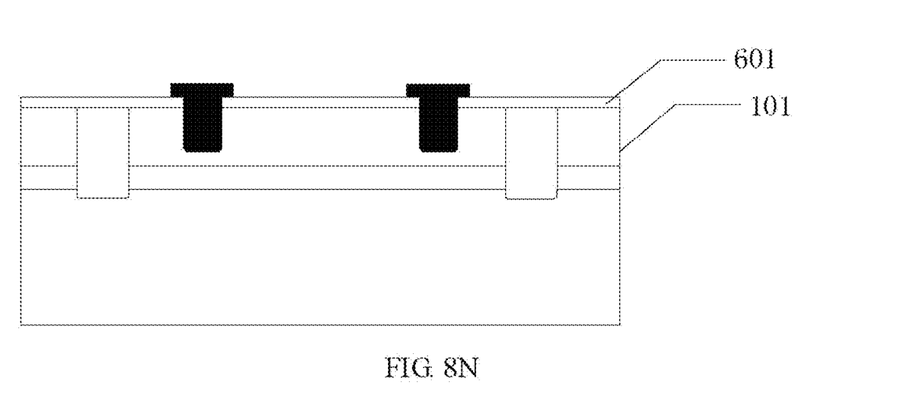
Figure 8O:
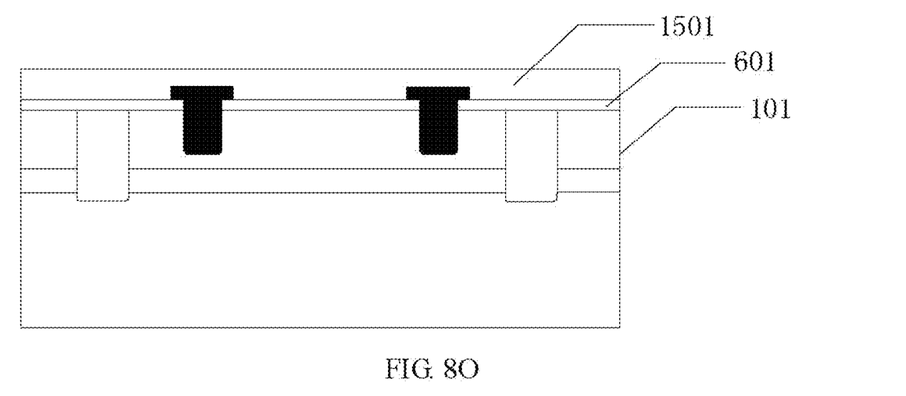
Figure 8P:
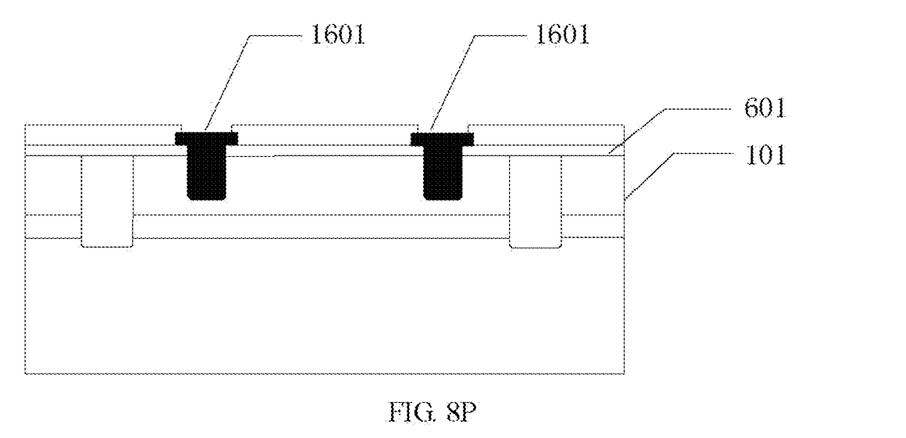
Figure 8Q:
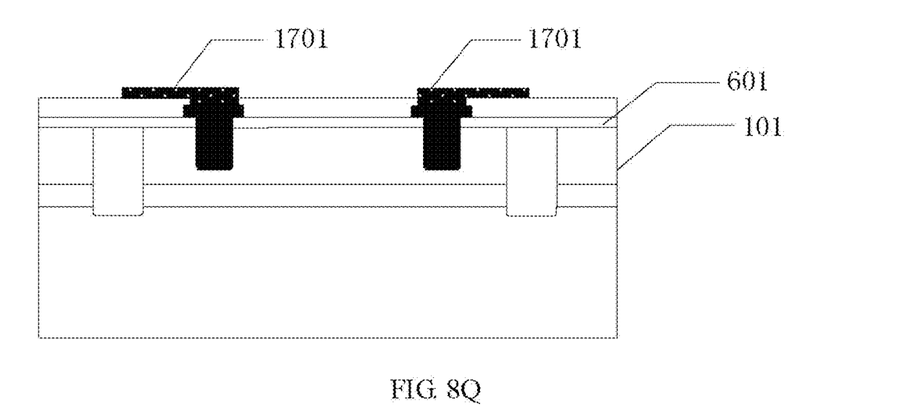
Figure 8R:
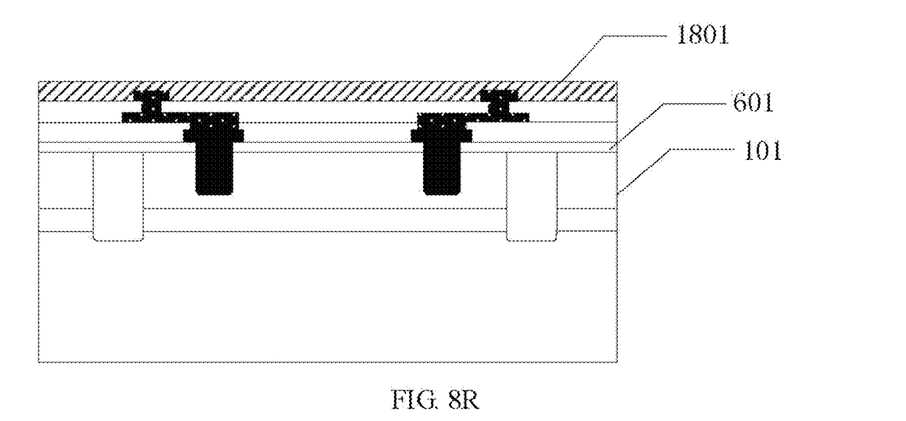

Referring to FIGS. 8A to 8R, FIGS. 8A to 8R are schematic views of another manufacturing method for an AlAs—Ge—AlAs structure based plasma p-i-n diode in a multilayered holographic antenna provided by an embodiment of the disclosure. Based on the above embodiment, preparation of an AlAs—Ge—AlAs structure based plasma p-i-n diode with a trench length of 22 nm (the length of a solid plasma region is 100 micrometers) is taken as an example for explanation in detail. The specific steps are as follows.

Step 1 is a step of preparing, a substrate material and includes:
- (1a) as shown in FIG. 8A, selecting a GeOI substrate 101 with a crystal orientation (100), a doping type of P-type and a doping concentration of $10^{14}$ cm$^{-3}$, a thickness of the top Ge layer being 50 µm;
- (1b) as shown in FIG. 8B, adopting a chemical vapor deposition (CVD) process to deposit a first SiO$_2$ layer 201 with a thickness of 40 nm on the GeOI substrate; and
- (1c) adopting a CVD process to deposit a first Si$_3$N$_4$/SiN layer 202 with a thickness of 2 µm on the substrate.

Step 2 is an isolation preparing step and includes:
- (2a) as shown in FIG. 8C, forming an isolation region on, the above protective layer by a photolithography process, wet-etching the first Si$_3$N$_4$/SiN layer 202 of the isolation region to form an isolation region pattern; and forming deep isolation trenches 301 with a width of 5 µm and a depth of 50 µm in the isolation region by a dry etching;
- (2b) as shown in FIG. 8D, depositing a SiO$_2$ 401 to fully fill the deep isolation trenches by a CVD method; and
- (2c) as shown in FIG. 8E, adopting a chemical mechanical polishing (CMP) process to remove the first Si$_3$N$_4$/SiN layer 202 and the first SiO$_2$ layer 201 on the surface, to make the surface of the GeOI substrate be planarized.

Step 3 is a step of preparing deep trenches of P and N regions and includes:
- (3a) as shown in FIG. 8F, continuously depositing two layers of materials on the substrate by a CVD process, the first layer being a second SiO$_2$ layer 601 with a thickness of 300 nm and the second layer being a second Si$_3$N$_4$/SiN layer 602 with a thickness of 500 nm.
- (3b) as shown in FIG. 8G, forming deep trenches of P and N regions by photolithography, wet-etching the second Si$_3$N$_4$/SiN layer 602 and the second SiO2 layer 601 of the P and N regions to form patterns of the P and N regions; and forming trenches 701 with a width of 4 µm and a depth of 5 µm in the P and N regions by a dry etching, lengths of the trenches in the P and N regions being determined according to an application condition of a prepared antenna;
- (3c) as shown in FIG. 8H, at 850 degrees Celsius, performing a high temperature treatment for 10 minutes, and oxidizing inner walls of the trenches to form oxide layers 801, so as to make the inner walls of the trenches of the P and N regions be smooth; and
- (3d) as shown in FIG. 8I, removing the oxide layers 801 on the inner walls of the trenches of the P and N regions by a wet etching process.

Step 4 is a step of preparing P and N contact regions and includes:
- (4a) as shown in FIG. 8J, depositing polycrystalline AlAs 1001 in the trenches of the P and N regions by a metal organic chemical vapor deposition (MOCVD) to fully fill the trenches;
- (4b) as shown in FIG. 8K, removing the polycrystalline AlAs 1001 and the second Si$_3$N$_4$/SiN layer 602 on the surface by a CMP process to make the surface be smooth/planarized;
- (4c) as shown in FIG. 8L, depositing, a layer of polycrystalline AlAs 1201 with a thickness of 200-500 nm on the surface by a CVD process;
- (4d) as shown in FIG. 8M, forming an active region in the P region by photolithography, and performing P+ implantation by an ion implantation process with a photoresist to make a doping concentration of the active region in the P region up to $0.5 \times 10^{20}$ cm$^{-3}$ and removing the photoresist to form a P contact 1301;
- (4e) forming an active region in the N region by photolithography, performing N+ implantation by an ion implantation process with a photoresist to make a doping concentration of the active region in the N region up to $0.5 \times 10^{20}$ cm$^{-3}$, and removing the photoresist to form N contact 1302;
- (4f) as shown in FIG. 8N, wet-etching the polycrystalline AlAs 1201 outside the P and N contact regions to form the P and N contact regions;
- (4g) as shown in FIG. 8O, depositing a SiO$_2$ 1501 with a thickness of 800 nm on the surface by a CVD process; and
- (4h) at 1000 degrees Celsius, annealing for 1 minute to activate ion implanted impurities and propel the impurities into the AlAs.

Step 5 is a step of forming the P-I-N diode and includes:
- (5a) as shown in FIG. 8P, forming lead holes 1601 in the P and N contact regions by photolithography;

(5b) as shown in FIG. 8Q, sputtering a metal on the surface of the substrate, alloying at 750 degrees Celsius to form a metal silicide 1701, and etching the metal on the surface;

(5c) sputtering a metal on the surface of the substrate and forming leads by photolithography; and (5d) as shown in FIG. 8R, depositing $Si_3N_4$/SiN to form a passivation layer 1801 and forming PADS by photolithography, to thereby form the P-I-N diode as a material for preparing a solid plasma antenna.

In the illustrated embodiment, the above various process parameters are all examples, and transformations made according to conventional means of those skilled in the art are all in a protection scope of the disclosure.

According to the p-i-n diode applied to a solid plasma reconfigurable antenna prepared by the disclosure, firstly, due to the characteristics of high mobility and long carrier service life of the used Ge material, a solid plasma concentration of the p-i-n diode is improved. Secondly, due to the characteristic of poor thermal stability of an oxide GeO of the Ge material, the treatment of flattening side walls of the trenches of the P region and the N region can be automatically finished in a high temperature environment, and the manufacturing method for the material is simplified. Thirdly, the GeOI-based p-i-n diode applied to the solid plasma reconfigurable antenna prepared by the disclosure adopts an etching-based deep trench dielectric isolation process, thereby effectively improving a breakdown voltage of the devices and inhibiting influences of a leak current on the device performances.

Figure 9:
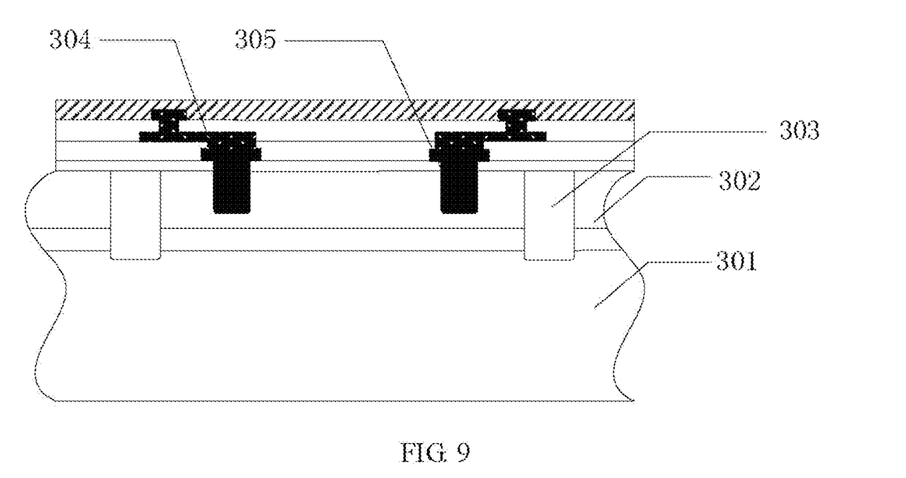
FIG. 9 is a schematic structural view of another AlAs—Ge—AlAs structure based plasma p-i-n diode in a multilayered holographic antenna provided by an embodiment of the disclosure.

Referring to FIG. 9, FIG. 9 is a schematic structural view of another AlAs—Ge—AlAs structure based plasma p-i-n diode in a multilayered holographic antenna provided by an embodiment of the disclosure. The AlAs—Ge—AlAs structure based plasma p-i-n diode is manufactured by the manufacturing method as shown in FIG. 2. Specifically, the AlAs—Ge—AlAs structure based plasma p-i-n diode is prepared on a GeOI substrate 301, and a P-type region 304 and an N-type region 305 of the p-i-n diode and an I region transversely located between the P-type region 304 and the N-type region 305 are all located in a top Ge layer 302 of the GeOI substrate. The p-i-n diode may adopt STI deep trench isolation, that is, one isolation trench 303 is disposed on the outer side of each of the P-type region 304 and the N-type region 305, and depths of the isolation trenches 303 are larger than or equal to a thickness of the top Ge layer 302.

In summary, specific examples are used herein to describe the principle and implementation manners of the disclosure. The description of the foregoing embodiments is merely used to help understand the method and core idea of the disclosure. At the same time, for those skilled in the art, according to the idea of the disclosure, some changes may be made in the specific implementations and application ranges. Sum up, the content of the present specification should not be construed as a limitation of disclosure. The protection scope of the disclosure should be covered by the appended claims.

INDUSTRIAL PRACTICABILITY

The manufacturing method for an AlAs—Ge—AlAs structure based plasma p-i-n diode according to the disclosure may have the following advantages.

(1) Due to the characteristics of high mobility and long carrier service life of the Ge material used by the p-i-n diode, a solid plasma concentration of the p-i-n diode can be effectively improved.

(2) The p-i-n diode adopts heterojunction structures, the i region is Ge and has high carrier mobility and narrower energy gap, the polycrystalline AlAs is filled into the P-type and N-type regions so as to form the heterojunction structures, and the energy gap of the AlAs materials is larger than that of Ge, thereby generating a high injection ratio and improving device performances.

(3) The p-i-n diode adopts the heterojunction structure, and a lattice mismatch ratio of the Ge of the i region to the polycrystalline AlAs of the P-type and N-type regions is lower. Therefore, defects in a heterojunction interface are less, and the device performances are improved.

(4) The p-i-n diode adopts an etching-based deep trench dielectric isolation process, thereby effectively improving a breakdown voltage of the device and inhibiting influences of a leak current on the device performances.

What is claimed is:

1. A manufacturing method for an aluminum arsenide-germanium-aluminum arsenide (AlAs—Ge—AlAs) structure based plasma p-i-n diode in a multilayered holographic antenna, wherein the plasma p-i-n diode is configured for preparing the multilayered holographic antenna, the multilayered holographic antenna comprises a semiconductor substrate, an antenna module, a first holographic ring and a second holographic ring; each of the antenna module, the first holographic ring and the second holographic ring is formed on the semiconductor substrate by a semiconductor process; and each of the antenna module, the first holographic ring and the second holographic ring comprises sequentially connected p-i-n diode strings; wherein the manufacturing method comprises:

(a) selecting a germanium-on-insulator (GeOI) substrate, preparing a silicon dioxide ($SiO_2$) material on a surface of the GeOI substrate to form a first $SiO_2$ layer, and preparing a silicon nitride (SiN) material on a surface of the first $SiO_2$ layer to form a first SiN layer, wherein the first $SiO_2$ layer and the first SiN layer constitute a first protective layer on the surface of the GeOI substrate;

(b) forming a first isolation region pattern on the first protective layer by a photolithography process;

(c) etching the first protective layer and the GeOI substrate in designated positions of the first isolation region pattern by a dry etching process, to form isolation trenches, wherein a depth of the isolation trenches being larger than or equal to a thickness of a top germanium (Ge) layer of the GeOI substrate;

(d) filling the isolation trenches to form an isolation region;

(e) etching the GeOI substrate to form a P-type trench and an N-type trench;

(f) depositing AlAs materials in the P-type trench and the N-type trench, and performing ion implantation into the AlAs materials in the P-type trench and the N-type trench to form a P-type active region and an N-type active region; and (g) forming leads on surfaces of the P-type active region and the N-type active region to obtain the AlAs—Ge—AlAs structure based plasma p-i-n diode.

2. The manufacturing method according to claim 1, wherein the step (e) comprises:

(e1) forming a second protective layer on a surface of the GeOI substrate;

(e2) forming a second isolation region pattern on the second protective layer by a photolithography process; and (e3) etching the second protective layer and the top Ge layer of the GeOI substrate in designated positions of the second isolation region pattern by a dry etching process, to form the P-type trench and the N-type trench in the top Ge layer of the GeOI substrate.

3. The manufacturing method according to claim 2, wherein the second protective layer comprises a second $SiO_2$ layer and a second SiN layer, and correspondingly the step (e1) comprises:
(e11) preparing a $SiO_2$ material on the surface of the GeOI substrate to form the second $SiO_2$ layer; and
(e12) preparing a SiN material on a surface of the second $SiO_2$ layer to form the second SiN layer.

4. The manufacturing method according to claim 1, before the step (f), further comprising:
(x1) oxidizing the P-type trench and the N-type trench to form oxide layers on inner walls of the P-type trench and the N-type trench; and
(x2) etching the oxide layers on the inner walls of the P-type trench and the N-type trench by a wet etching process, to planarize the inner walls of the P-type trench and the N-type trench.

5. The manufacturing method according to claim 1, wherein the step (f) comprises:
(f1) depositing the AlAs materials in the P-type trench and the N-type trench and on an entire surface of the substrate by a metal organic chemical vapor deposition (MOCVD) process;
(f2) forming an AlAs layer on the GeOI substrate after planarizing the GeOI substrate by a chemical mechanical polishing (CMP) process;
(f3) patterning the AlAs layer by photolithography, and implanting a P-type impurity and an N-type impurity respectively into positions where the P-type trench and the N-type trench are located by an ion implantation process with a photoresist, to form the P-type active region and the N-type active region and meanwhile form a P-type contact region and an N-type contact region;
(f4) removing the photoresist; and
(f5) removing the AlAs materials outside the P-type contact region and the N-type contact region by a wet etching process.

6. The manufacturing method according to claim 1, after the step (f), further comprising:
(y1) preparing an $SiO_2$ material on an entire surface of the substrate; and
(y2) activating impurities in the P-type active region and the N-type active region by an annealing process.

7. The manufacturing method according to claim 6, wherein the step (g) comprises:
(g1) etching the $SiO_2$ materials in designated positions on surfaces of the P-type contact region and the N-type contact region by an anisotropic etching process to form lead holes; and
(g2) depositing metal materials into the lead holes, performing a passivation treatment on the substrate and forming contact pads by photolithography, to form the AlAs—Ge—AlAs structure based plasma p-i-n diode.

8. The manufacturing method according to claim 1, wherein the antenna module comprises a first p-i-n diode antenna arm, a second p-i-n diode antenna arm, a coaxial feeder, a first direct current (DC) bias wire, a second DC bias wire, a third DC bias wire, a fourth DC bias wire, a fifth DC bias wire, a sixth DC bias wire, a seventh DC bias wire and an eighth DC bias wire;
wherein an inner core wire and an outer conductor of the coaxial feeder are respectively welded on the first DC bias wire and the second DC bias wire; the first DC bias wire, the fifth DC bias wire, the third DC bias wire and the fourth DC bias wire are electrically connected to the first p-i-n diode antenna arm and arranged along a lengthwise direction of the first p-i-n diode antenna arm; and
wherein the second DC bias wire, the sixth DC bias wire, the seventh DC bias wire and the eighth DC bias wire are electrically connected to the second p-i-n diode antenna arm and arranged along a lengthwise direction of the second p-i-n diode antenna arm.

9. The manufacturing method according to claim 8, wherein each of the p-i-n diode strings comprises a plurality of p-i-n diodes; and each of the p-i-n diodes comprises a P+ region, an N+ region and an intrinsic region, and further comprises a first metal contact region and a second metal contact region;
wherein one end of the first metal contact region is electrically connected to the P+ region while the other end is electrically connected to one of the DC bias wires or the second metal contact region of an adjacent p-i-n diode; and one end of the second metal contact region is electrically connected to the N+ region while the other end is electrically connected to one of the DC bias wires or the first metal contact region of an adjacent p-i-n diode.

10. The manufacturing method according to claim 1, wherein the multilayered holographic antenna further comprises: at least one third holographic ring, disposed on an outer side of the second holographic ring and formed on the semiconductor substrate by the semiconductor process.

\* \* \* \* \*